(12) United States Patent
Nguyen et al.

(10) Patent No.: US 7,923,305 B1
(45) Date of Patent: Apr. 12, 2011

(54) PATTERNING METHOD FOR HIGH DENSITY PILLAR STRUCTURES

(75) Inventors: Natalie Nguyen, San Jose, CA (US);
Paul Wai Kie Poon, Fremont, CA (US);
Steven J. Radigan, Fremont, CA (US);
Michael Konevecki, San Jose, CA (US);
Yung-Tin Chen, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/686,201

(22) Filed: Jan. 12, 2010

(51) Int. Cl.
*H01L 21/82* (2006.01)

(52) U.S. Cl. ........ 438/128; 438/131; 438/488; 438/491; 257/E21.023

(58) Field of Classification Search ............... 438/128, 438/129, 131, 132, 488, 491, 492, 497, 500, 438/503
See application file for complete search history.

(56) References Cited

U.S. PATENT DOCUMENTS

| | | | |
|---|---|---|---|
| 5,024,971 A | 6/1991 | Baker et al. | |
| 5,482,885 A | 1/1996 | Lur et al. | |
| 5,739,068 A | 4/1998 | Jost et al. | |
| 5,915,167 A | 6/1999 | Leedy | |
| 5,977,638 A | 11/1999 | Rodgers et al. | |
| 6,055,180 A | 4/2000 | Gudesen et al. | |
| 6,096,659 A | 8/2000 | Gardner et al. | |
| 6,420,231 B1 | 7/2002 | Harari et al. | |
| 6,853,049 B2 | 2/2005 | Herner | |
| 6,855,614 B2 | 2/2005 | Metzler | |
| 6,946,719 B2 | 9/2005 | Petti et al. | |
| 6,952,030 B2 | 10/2005 | Herner et al. | |
| 7,081,377 B2 | 7/2006 | Cleeves | |
| 7,176,064 B2 | 2/2007 | Herner | |
| 7,211,866 B2 | 5/2007 | Yuan et al | |
| 7,271,057 B2 | 9/2007 | Eppich | |
| 2002/0052068 A1 | 5/2002 | Juengling | |
| 2003/0157436 A1 | 8/2003 | Manger et al. | |
| 2003/0178684 A1 | 9/2003 | Nakamura | |

(Continued)

FOREIGN PATENT DOCUMENTS

EP 0 288 739 A2 11/1988

(Continued)

OTHER PUBLICATIONS

U.S. Appl. No. 09/560,626, filed Apr. 28, 2000, Knall.

(Continued)

*Primary Examiner* — Charles D Garber
*Assistant Examiner* — Reema Patel
(74) *Attorney, Agent, or Firm* — The Marbury Law Group, PLLC

(57) ABSTRACT

A method of making a device includes forming a first sacrificial layer over an underlying layer, forming a first photoresist layer over the first sacrificial layer, patterning the first photoresist layer to form first photoresist features, rendering the first photoresist features insoluble to a solvent, forming a second photoresist layer over the first photoresist features, patterning the second photoresist layer to form second photoresist features, etching the first sacrificial layer using both the first and the second photoresist features as a mask to form first sacrificial features, forming a spacer layer over the first sacrificial features, etching the spacer layer to form spacer features and to expose the sacrificial features, removing the first sacrificial features, and etching at least part of the underlying layer using the spacer features as a mask.

28 Claims, 9 Drawing Sheets

U.S. PATENT DOCUMENTS

| | | | |
|---|---|---|---|
| 2004/0245557 A1 | 12/2004 | Seo et al. | |
| 2005/0052915 A1 | 3/2005 | Herner et al. | |
| 2005/0226067 A1 | 10/2005 | Herner et al. | |
| 2006/0035167 A1 | 2/2006 | Angelopoulos et al. | |
| 2006/0177977 A1 | 8/2006 | Chan et al. | |
| 2006/0216937 A1 | 9/2006 | Dunton et al. | |
| 2006/0228895 A1* | 10/2006 | Chae et al. | 438/725 |
| 2006/0250836 A1 | 11/2006 | Herner et al. | |
| 2006/0250837 A1 | 11/2006 | Herner et al. | |
| 2006/0273298 A1 | 12/2006 | Petti | |
| 2006/0292301 A1 | 12/2006 | Herner | |
| 2007/0049035 A1 | 3/2007 | Tran | |
| 2007/0072360 A1 | 3/2007 | Kumar et al. | |
| 2007/0099431 A1 | 5/2007 | Li | |
| 2007/0114509 A1 | 5/2007 | Herner | |
| 2007/0158688 A1 | 7/2007 | Caspary et al. | |
| 2007/0164309 A1 | 7/2007 | Kumar et al. | |
| 2007/0176160 A1 | 8/2007 | Uchiyama et al. | |
| 2007/0197014 A1 | 8/2007 | Jeon et al. | |
| 2008/0013364 A1* | 1/2008 | Kumar et al. | 365/148 |
| 2008/0014533 A1 | 1/2008 | Keller et al. | |
| 2008/0085600 A1 | 4/2008 | Furukawa et al. | |
| 2008/0128867 A1 | 6/2008 | Lee | |
| 2008/0299465 A1* | 12/2008 | Bencher et al. | 430/5 |
| 2009/0149026 A1 | 6/2009 | Zhou et al. | |

FOREIGN PATENT DOCUMENTS

| | | |
|---|---|---|
| EP | 1 818 977 A2 | 8/2007 |
| WO | WO 2007/103343 A1 | 9/2007 |

OTHER PUBLICATIONS

U.S. Appl. No. 11/159,031, filed Jun. 22, 2005, Herner.
U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/000,758, filed Dec. 17, 2007, Petti et al.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/149,151, filed Apr. 28, 2008, Chen et al.
U.S. Appl. No. 12/216,107, filed Jun. 30, 2008, Chan.
U.S. Appl. No. 12/216,924, filed Jul. 11, 2008, Ping et al.
U.S. Appl. No. 12/222,293, filed Aug. 6, 2008, Chan.
U.S. Appl. No. 12/285,466, filed Oct. 6, 2008, Chung-Ming Wang et al.
Office Action mailed Jul. 22, 2009, received in U.S. Appl. No. 12/000,758.
Office Action mailed Jul. 28, 2009, received in U.S. Appl. No. 12/149,151.
Partial International Search Report mailed Oct. 21, 2009, in International application No. PCT/US2009/048584.
International Search Report and Written Opinion mailed Oct. 9, 2009, received in International application No. PCT/US2009/048581.
International Search Report and Written Opinion mailed Sep. 7, 2009, received in International application No. PCT/US2009/002400.
Kim, Ryoung H. et al., "Double Exposure Using 193 nm Negative Tone Photoresist", Optical Microlithography XX, Proc of SPIE, vol. 6520, 65202M, 2007, 8 pgs.
Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.
Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.
International Search Report and Written Opinion mailed Mar. 4, 2010 received in International Application No. PCT/US2009/059188.

* cited by examiner

PATTERNING METHOD FOR HIGH DENSITY PILLAR STRUCTURES

BACKGROUND OF THE INVENTION

The invention generally relates to a method of making a semiconductor device, and more particularly, to a method of making semiconductor pillar structures.

Devices made from semiconductor materials are used to create memory circuits in electrical components and systems. Memory circuits are the backbone of such devices as data and instruction sets are stored therein. Maximizing the number of memory elements per unit area on such circuits minimizes their cost. As the dimensions for structures formed on a semiconductor wafer diminish, tools currently available to create these devices reach their limits.

SUMMARY OF THE EMBODIMENTS

One embodiment of the invention provides a method of making a device including forming a first sacrificial layer over an underlying layer, forming a first photoresist layer over the first sacrificial layer, patterning the first photoresist layer to form first photoresist features, rendering the first photoresist features insoluble to a solvent, forming a second photoresist layer over the first photoresist features, patterning the second photoresist layer to form second photoresist features, etching the first sacrificial layer using both the first and the second photoresist features as a mask to form first sacrificial features, forming a spacer layer over the first sacrificial features, etching the spacer layer to form spacer features and to expose the sacrificial features, removing the first sacrificial features, and etching at least part of the underlying layer using the spacer features as a mask.

Another embodiment of the invention provides a method of making a device including forming a first sacrificial layer over an underlying layer, forming a first photoresist layer over the first sacrificial layer, patterning the first photoresist layer to form first photoresist features, rendering the first photoresist features insoluble to a solvent, forming a second photoresist layer over the first photoresist features, patterning the second photoresist layer to form second photoresist features, etching the first sacrificial layer using both the first and the second photoresist features as a mask to form first sacrificial features, forming a spacer layer over the first sacrificial features, etching the spacer layer to form spacer features and to expose the first sacrificial features, removing the first sacrificial features, etching the underlying layer using the spacer features as a mask to form openings in the underlying layer, and forming semiconductor features in the openings in the underlying layer.

Another embodiment of the invention provides a method of making a non-volatile memory device including forming a switching material layer over a substrate, forming a semiconductor seed layer over the switching material layer, forming an underlying layer over the semiconductor seed layer, forming a first photoresist layer over the underlying layer, patterning the first photoresist layer to form first photoresist features, rendering the first photoresist features insoluble to a solvent, forming a second photoresist layer over the first photoresist features, patterning the second photoresist layer to form second photoresist features, etching the first sacrificial layer using both the first and the second photoresist features as a mask to form first sacrificial features, removing the first and the second photoresist features, forming a spacer layer over the first sacrificial features, etching the spacer layer to form spacer features and to expose the sacrificial features, removing the first sacrificial features, etching the underlying layer using the spacer features as a mask to form openings in the underlying layer, forming semiconductor features on the semiconductor seed layer exposed in the openings in the underlying layer, removing the underlying layer, etching the semiconductor seed layer using the semiconductor features as a mask, etching the switching material layer using the semiconductor features as a mask to form switching material features, and forming an insulating filler layer between adjacent semiconductor features and between adjacent switching material features, where the etched semiconductor seed layer comprises lower portions of diodes, the semiconductor features comprise upper portions of the diodes, the diodes comprise steering elements of non-volatile memory cells, and the switching material features comprise storage elements of the non-volatile memory cells.

Another embodiment of the invention provides a method of making a device including forming a first photoresist layer over an underlying layer, patterning the first photoresist layer to form first photoresist features, rendering the first photoresist features insoluble to a solvent, forming a second photoresist layer over the first photoresist features, patterning the second photoresist layer to form second photoresist features, forming a spacer layer over the first and second photoresist features, etching the spacer layer to form spacer features, removing the first and second photoresist features, and etching at least part of the underlying layer using the spacer features as a mask.

DETAILED DESCRIPTION OF THE PREFERRED EMBODIMENTS

One embodiment of the invention provides a method of making a device including forming a first sacrificial layer over an underlying layer, forming a first photoresist layer over the first sacrificial layer, and patterning the first photoresist layer to form first photoresist features. The method further includes rendering the first photoresist features insoluble to a solvent, forming a second photoresist layer over the first photoresist features, patterning the second photoresist layer to form second photoresist features, and etching the first sacrificial layer using both the first and the second photoresist features as a mask to form first sacrificial features. The method further includes forming a spacer layer over the first sacrificial features, etching the spacer layer to form spacer features and to expose the first sacrificial features, removing the first sacrificial features, and etching at least part of the underlying layer using the spacer features as a mask to form openings in the underlying layer.

The openings formed in the underlying layer may be then filled by any desirable materials. For example, the openings in the underlying layer may serve as contact holes and be filled by conductive material, such as metal, silicide or polysilicon, which forms electrodes of an underlying device, such as a diode or transistor, or interconnects to lower level electrodes or metallization. In the embodiment of FIG. 4 below, the underlying layer itself is insulating and forms an interlevel or a device level insulating layer. In the embodiment of FIG. 5 below, the underlying layer is sacrificial and the interlevel or a device level insulating layer is filled in around the electrodes or interconnects. In another embodiment, the openings may be filled by a semiconductor material, resulting in pillar-shape semiconductor devices, such as pillar-shaped diodes as will be illustrated in the embodiments of FIGS. 4 and 5 below.

FIGS. 1A through 1E show side cross-sectional views illustrating stages in formation of a device using a first embodiment. FIGS. 2A through 2E show top views of the corresponding stages.

Figure 1A:
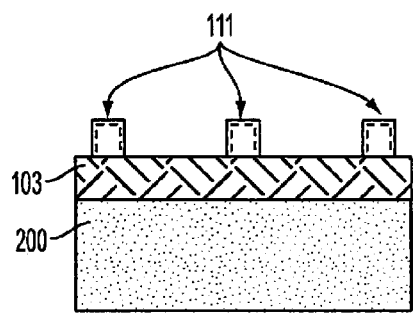
FIGS. 1A-1E and 3C-3F are side cross-sectional views illustrating a process flow of one embodiment.

Referring to FIG. 1A, a sacrificial layer 103 is formed over an underlying layer 200. A first photoresist layer can be formed over the sacrificial layer 103, followed by patterning the photoresist layer to form first photoresist features 111. The first photoresist features 111 are pillar-shaped, as illustrated by circles 1 in FIG. 2A. FIG. 1A is a side cross sectional view along line A-A in FIG. 2A. Additional layers may be formed below, above or between layers 103, 111 and 200 as will be described in more detail below.

The first photoresist features 111 are then rendered insoluble to a solvent used for forming the second photoresist features. Any suitable methods can be used to render the first photoresist features 111 insoluble. For example, the methods described in U.S. patent application Ser. No. 11/864,205 and in U.S. patent application Ser. No. 12/216,107, which are incorporated by reference in their entirety, may be used. In some embodiments, the first photoresist features 111 may be rendered insoluble by applying a reactive reagent, causing the residual acids in the photoresist features 111 to chemically react with the reactive reagent to form a barrier layer or coating on upper and side surfaces of the first photoresist features 111 (i.e., to "freeze" the first photoresist features 111). This barrier layer can be formed by causing cross-linking on the surface of the pattern 111 or by any other suitable methods. The barrier layer may comprise a thin polymer film having a thickness of less than 10 nm, preferably about 1-2 nm. This layer is disposed on a surface of first photoresist features 111, protecting the first photoresist features 111 from being dissolved by the solvent used during the step of forming second photoresist features.

Figure 1B:
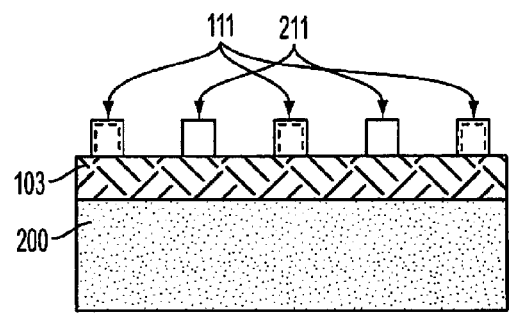
Figure 2A:
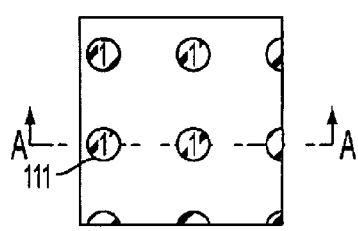
FIGS. 2A-2E are illustrative top views of the structures shown in FIGS. 1A-1E, respectively.
Figure 2B:
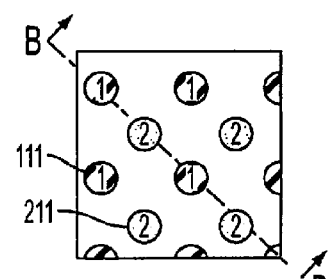

Turning to FIG. 1B, the pitch of the photoresist features patterns is doubled by forming a second photoresist layer over the first photoresist features 111, followed by patterning the second photoresist layer to form second photoresist features 211. The second photoresist features 211 are also pillar-shaped, as illustrated by circles 2 in FIG. 2B. FIG. 1B is a side cross sectional view along line B-B in FIG. 2B. If desired, the first and second photoresist features 111 and 211 may optionally be trimmed to reduce their diameter.

The first and second photoresist materials may be any suitable photoresist material(s), preferably acrylate materials, such as poly(methyl acrylate) or poly(methyl methacrylate). The first and second photoresist materials may be same or different. For example, the second photoresist material may have a thinner viscosity than the first photoresist material.

In some embodiments, when the first photoresist is an acrylic material, the reactive reagent may be the same acrylic material with an active functional group on the side chain. The reactive reagent can be a chemical shrink material, such as CSX004, FZX F112 or FZX F114 which comprises a poly(methyl) acrylate derivative, melamine resin, and other ingredients including water, methyl isobutyl carbinol, n-butyl alcohol, or combinations thereof. For example, FZX F114 comprises a poly(methyl) acrylate derivative, and a solvent containing methyl isobutyl carbinol and n-butyl alcohol having a volume ratio of 70:30 to 90:10, such as a volume ratio of 80:20. CSX004, FZX F112 and FZX F114 are all available from JSR Micro (http://www.jsrmicro.com). Another chemical shrink material, RELACS® available from AZ Electronic Materials or other reactive reagents which are used in the prior art to reduce the dimensions of openings between adjacent resist patterns (i.e., which are used to widen small resist patterns), may also be used.

Other freezing methods may also be used to protect the first photoresist features 111 from being dissolved by solvent(s) used (i.e., to render the first photoresist features 111 insoluble) in the step of patterning the second photoresist layer. For example, a protective agent may selectively replace some functional groups of the first photoresist polymer, which in turn renders the first photoresist insoluble to the solvent(s). Alternatively, the first photoresist may crosslink with a compatible chemistry under a desired condition, such as an application of heat (e.g., a high temperature bake), or other desired treatments, to "freeze" the first photoresist features 111.

Figure 1C:
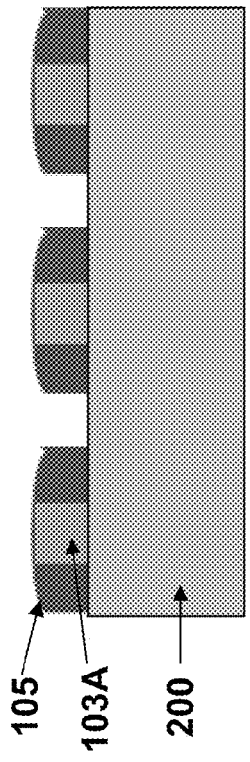

The first sacrificial layer 103 can then be etched using both the first 111 and the second 211 photoresist features as a mask to form first sacrificial features, as shown in FIG. 1C. The first sacrificial features 103A have the shape of both the first and second photoresist features, and thus the top view of the pattern of the first sacrificial features 103A is composed of both circles 1 and circles 2 shown in FIG. 2C. FIG. 1C is a side cross sectional view along line C-C in FIG. 2C. Features 103A may be optionally trimmed to reduce their diameter.

Figure 1D:
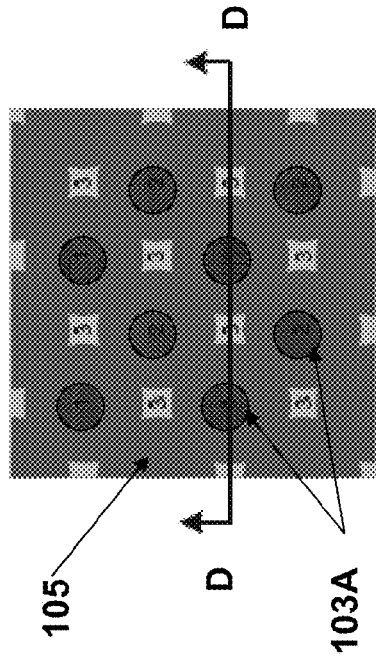
Figure 2C:
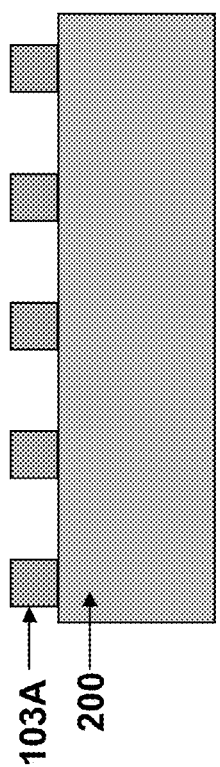
Figure 2D:
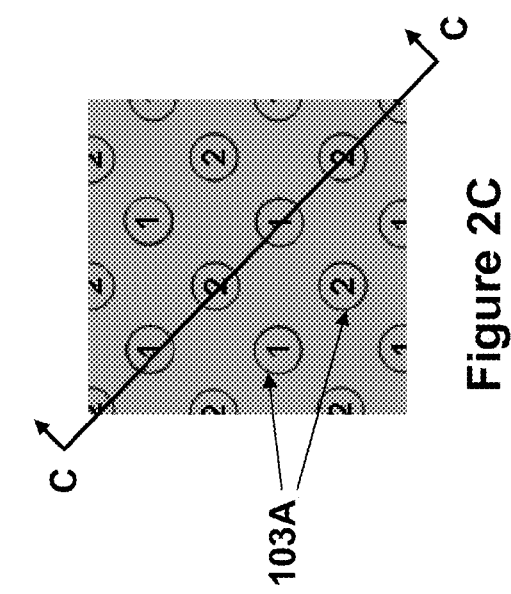

Next, spacer features 105 (e.g., a sidewall spacer around each cylindrical feature 103A pillar) can be formed surrounding the first sacrificial features 103A, as shown in FIGS. 1D and 2D. Spacer features 105 may be formed by conventional sidewall spacer formation methods, such as by depositing a film over the sacrificial features 103A and then anisotropically etching the film to leave the cylindrical spacer features 105 surrounding the first sacrificial features 103A. The step of etching the spacer layer exposes the underlying layer 200 in the openings 3, as shown in FIG. 2D. FIG. 1D is a side cross sectional view along line D-D in FIG. 2D.

Figure 1E:
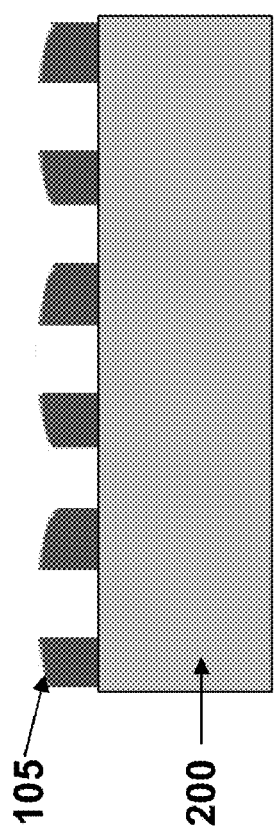
Figure 2E:
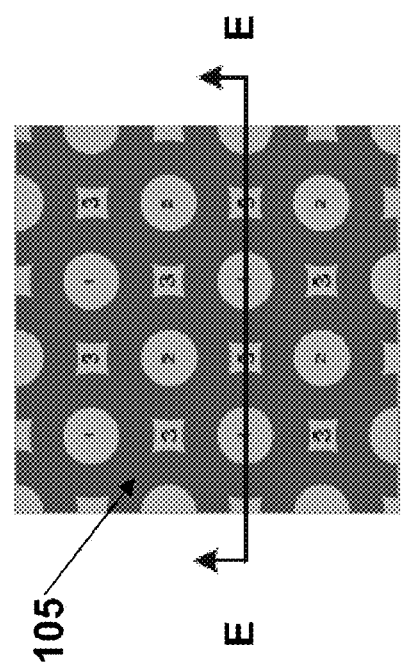

Further, the first sacrificial features 103A can be selectively removed, such as by selective etching, leaving the spacer features 105 over the underlying layer, as shown in FIG. 1E. Three types of openings (1, 2 and 3) are formed between the spacer features 105, as shown in FIG. 2E. FIG. 1E is a side cross sectional view along line E-E in FIG. 2E. The openings 1 and 2 expose the area originally covered by the first photoresist features 111 and the second photoresist features 211, respectively.

Thus, openings 1 and 2 have a cylindrical shape while openings 3 have a quasi-cylindrical shape as shown in FIG. 2E. A quasi-cylindrical shape is a shape that has a cross section formed by four bordering annular spacer features 105. This shape has a cross section that is similar to a distorted circle, square or a rectangle depending on the distance between adjacent spacer features 105 and may include concave sidewalls which mirror the convex shape of the bordering spacer features 105.

Openings 1 may be arranged in a repeating square pattern with one opening 2 located in the middle of the imaginary square formed by openings 1 at each corner, and with a respective opening 3 located at the center point of each imaginary line which makes up the sides of the imaginary square between openings 1, as shown in FIG. 2E. Another way to describe this pattern is that openings 1 and 2 form overlapping squares with the corner of each square of openings 2 located in the middle of each square of openings 1 and vise-versa. Openings 3 form a rhombus having opening 1 or opening 2 in the center. Thus, the adjacent imaginary horizontal lines in FIG. 2E extend through alternating openings 1 and 3 or 2 and 3, while adjacent imaginary diagonal lines extend through either openings 3 or alternating openings 1 and 2. Thus, the original pitch of openings 1 and 2 has been doubled by adding openings 3.

Figure 3A:
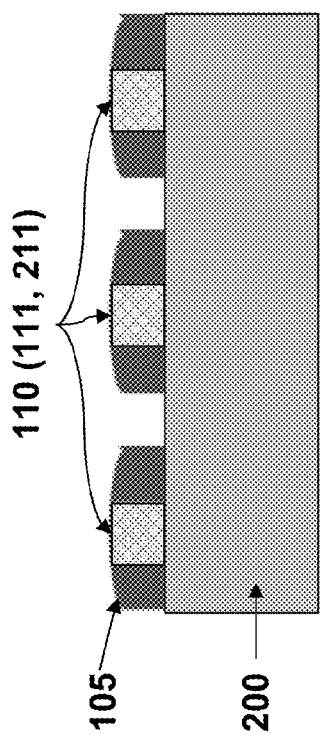
FIGS. 3A-3B are respectively a side cross-sectional view and a top view illustrating an alternative embodiment.
Figure 3B:
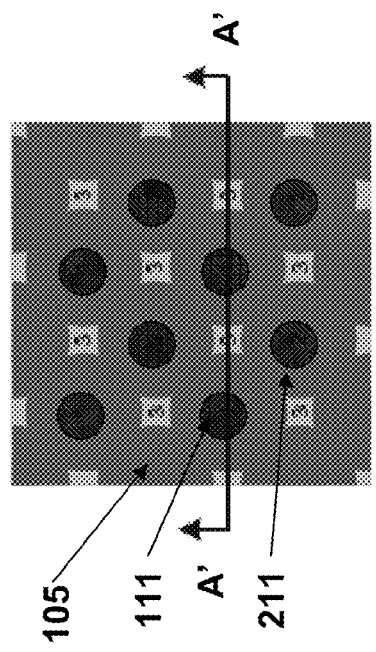

In an alternative embodiment, the spacer features 105 may be formed surrounding the first and second photoresist features 110 (111 and 211), instead of surrounding the sacrificial features 103A, as shown in FIGS. 3A and 3B. FIG. 3A is a side cross sectional view along line A'-A' in FIG. 3B. In this alternative embodiment, the first sacrificial layer 103 may be omitted if desired. The photoresist features 110 can then be selectively removed to obtain the structure shown in FIGS. 1E (side cross-sectional view) and 2E (top image). The spacer features 105 may be formed by a low temperature silicon oxide CVD deposition which does not damage the photoresist features 110 followed by anisotropic etching.

The sacrificial layer 103 and the sacrificial features 103A can be made of any suitable sacrificial materials, for example oxide or nitride materials or organic hard mask materials, including amorphous carbon (which may be referred to as a-C). In some embodiments, the amorphous carbon material may be an advanced patterning film (APF). The spacer features 105 may be made of a conductive, insulating or semiconductor material different from that of the upper portions of the sacrificial features. The spacer material can be selected i) such that it can be selectively anisotropically etched with dry etch chemistry compared to the material of the sacrificial features; and ii) such that the sacrificial features 103A of FIGS. 1-2 or the photoresist features 110 of FIG. 3 can be selectively removed (such as isotropically etched) compared to the material of the spacer features 105 using a different dry or wet etch chemistry. For example, the spacer material such as silicon oxide or silicon nitride can be deposited by a low temperature CVD process on the a-C or photoresist features and etched by wet etching methods. Of course, other suitable material combinations of the spacer features and the photoresist/sacrificial features may also be used.

In some other embodiments, one or more of bottom antireflective coating (BARC) layer (which can be an organic dielectric material) and/or dielectric antireflective coating (DARC) layer may be formed over the sacrificial layer 103 prior to forming the first photoresist features 111. Preferably, the BARC layer is formed over the DARC layer, which in turn is formed over the sacrificial layer 103. In these embodiments, the DARC layer is patterned using the combination of the first and the second photoresist features as a mask, and the sacrificial layer 103 is patterned to form sacrificial features 103A using at least the patterned DARC layer as a mask prior to the step of forming the spacer features 105.

Figure 3C:
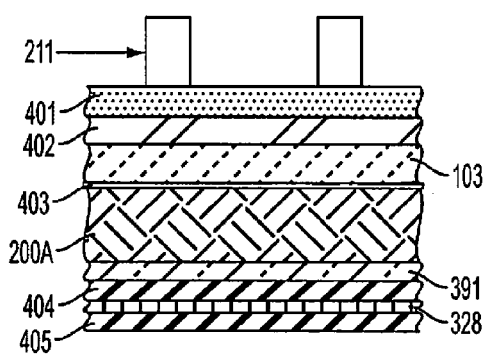

For example, as shown in FIG. 3C, the DARC layer 402 (10-30 nm thick, such as 20 nm thick) is located above the a-C sacrificial layer 103 (30-100 nm thick, such as 50 nm thick) and a BARC layer 401 (15-40 nm thick, such as 25 nm thick) is located above the DARC layer. The photoresist features 111 (not shown in the cross section of FIG. 3C) and 211 may comprise 120 and 80 nm lithography resist. If the pitch of features 111 is 90 nm, then the same lithography mask may be shifted 45 nm (e.g., half pitch) in the X and Y directions to expose the second photoresist features 211. The final pitch of features 111 and 211 is about 64 nm. Of course other pitches may be used.

Furthermore, as shown in FIG. 3C, the underlying layer 200 may comprise a thin silicon oxide etch stop layer 403, a second a-C layer 200A (100-150 nm thick, such as 110 nm thick), a thin p+ or n+ doped polysilicon seed layer 391 (5-15 nm thick, such as 10 nm thick), and a switching material layer 328 (3-10 nm thick, such as 5 nm thick, which will be described in more detail below) located between two conductive layers 404 and 405, such as titanium and/or TiN layers (5-15 nm thick, such as 10 nm thick).

Figure 3D:
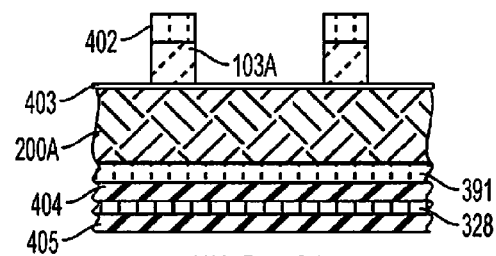
Figure 3E:
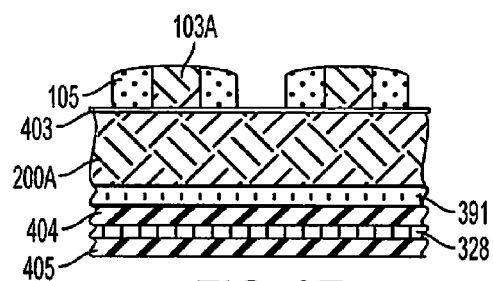
Figure 3F:
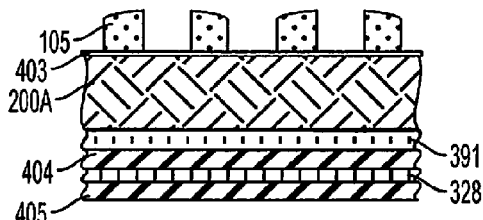

As shown in FIG. 3D, the BARC layer is etching using the photoresist features as a mask. The DARC layer is then etched using the patterned BARC layer and optionally the photoresist features as a mask. The BARC layer and the photoresist features may then be removed. The a-C sacrificial layer 103 is then etched using the patterned DARC layer as a mask to form a-C sacrificial features 103A. Preferably, the DARC layer 402 is completely removed prior to the subsequent step of removing a-C sacrificial features 103A, since residual DARC may impede the complete removal of the a-C features 103A. The etching of layer 103 stops on the etch stop layer 403. Then, as shown in FIG. 3E, silicon nitride spacer features 105 are formed on the sacrificial features 103A and over the etch stop layer 403. After the removal of the sacrificial features 103A, as shown in FIG. 3F, the etch stop layer 403 and the underlying layer 200A can be etched using the spacer features 105 as a mask, as will be described with respect to the embodiments of FIGS. 4 and 5 below. While specific sublayers of the underlying layer 200 are described above, it should be noted that the underlying layer 200 may be made of any suitable materials including insulating, semiconductor or a conductive layer.

In the embodiment of FIG. 4, the switching material layer 328 is formed on top of a memory cell and is omitted from the underlying layer 200. In this embodiment, the underlying layer 200 comprises an insulating layer 612 located over a substrate 100, as shown in FIG. 4A. The insulating layer 612 can be then be etched using the spacer features 105 as a mask to form openings 61. The openings 61 in the insulating layer 612 can be pillar shaped. In some embodiments, at least some of the openings 61 are cylindrical and others are quasi-cylindrical. The spacer features 105 can then be removed, forming the structure shown in FIG. 4B.

Figure 4A:
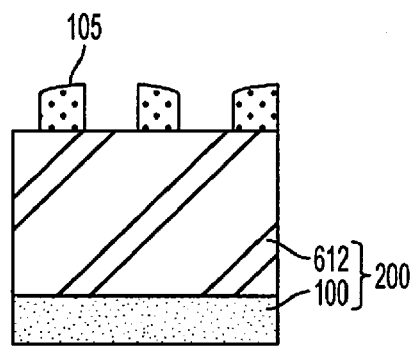
FIGS. 4A-4E are side cross-sectional views illustrating a process flow of another embodiment.
Figure 4B:
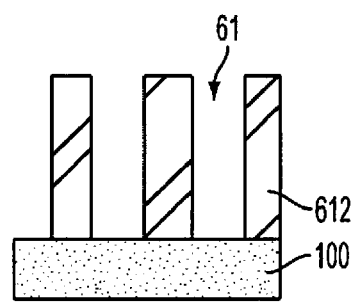
Figure 4C:
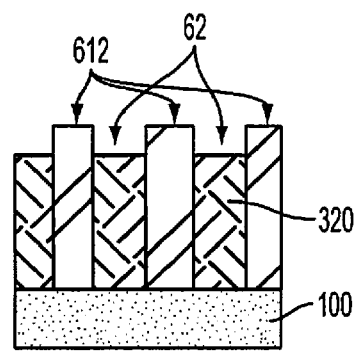

Referring to FIG. 4C, semiconductor features 320 can then be formed by partially filling the openings 61, leaving recesses 62 over the semiconductor features 320. The semiconductor features 320 can be formed by any suitable methods. For example, the semiconductor features 320 may be formed by selectively depositing the semiconductor material to partially fill the openings 61 in the insulating layer 612 to leave recesses 62 over the semiconductor features 320. Alternatively, the step of forming the semiconductor features 320 may comprise depositing semiconductor material to completely fill the openings 61 first, followed by a step of recessing the semiconductor material to form recesses 62 over the semiconductor features 320, as by selective etching. The semiconductor material may also optionally be deposited over the top of insulating layer 612 followed by planarization with the top of layer 612 by chemical mechanical polishing (CMP) or other suitable methods prior to the recessing etch step. Any suitable selective or non-selective depositing methods may be used.

In some embodiments, the semiconductor features 320 are used to form diodes. The diodes may have a bottom heavily doped n-type region, an optional intrinsic region (a region which is not intentionally doped), and a top heavily doped p-type region. The orientation of the diodes may be reversed (e.g., p-type on the bottom and n-type on top). The diodes may be formed by depositing intrinsic semiconductor material on the n-type or p-type seed material followed by implanting the other one of the n-type or p-type dopants into the upper portion of the diodes. Alternatively, the upper regions of the p-i-n diodes may be formed by depositing a doped semiconductor material on the intrinsic semiconductor material. Other diodes, such as p-n diodes, punch through diodes, etc. may be formed instead of the p-i-n diodes.

Figure 4D:
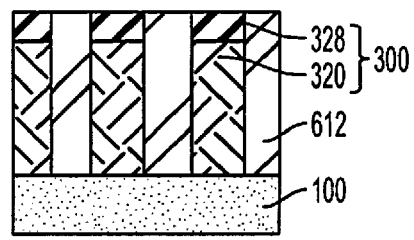

Next, switching material features 328 can then be formed over the semiconductor features 320, resulting in a structure shown in FIG. 4D. The switching material features 328 may be formed by depositing switching material in the recesses 62 and optionally over the top of layer 612 followed by optional planarization by CMP or other suitable methods using top of features 612 as a stop.

Figure 4E:
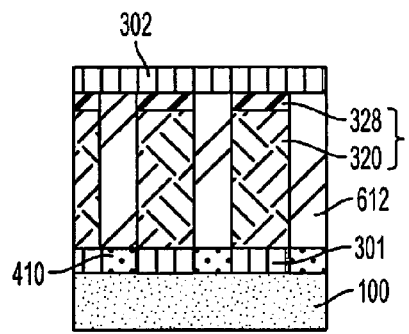
Figure 4F:
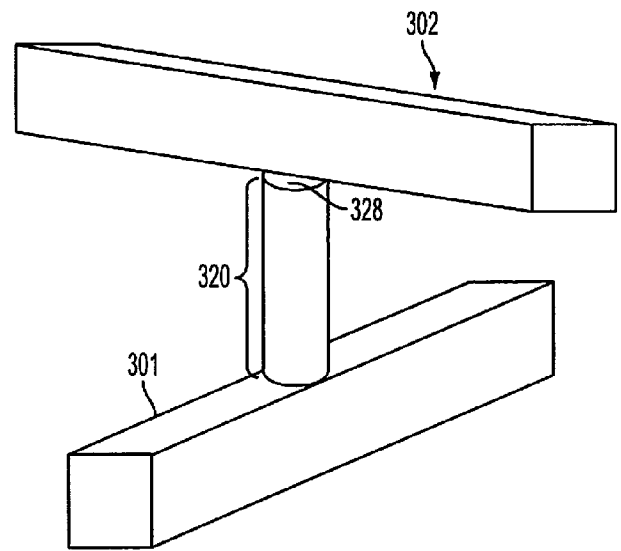
FIG. 4F is a perspective view of the structure shown in FIG. 4E.

In some embodiments, the switching material features 328 are storage elements of non-volatile memory cells 300 and the diodes 320 are steering elements of the non-volatile memory cells 300. Each of the non-volatile memory cells 300 can be a vertical pillar shaped cell disposed between a bottom electrode 301 and a top electrode 302, as illustrated in FIG. 4E. The pillars 300 that were formed in openings 1 and 2 have a cylindrical shape, while the pillars 300 that were formed in openings 3 have a quasi-cylindrical shape. Thus, the pillars have two different shapes at the locations 1, 2 and 3 described above.

In this embodiment, the rail shaped bottom electrodes 301 separated by insulating material 410 are provided below the insulating layer 612 shown in FIG. 4A, and the step of etching the insulating layer 612 using the spacer features 105 as a mask exposes a part of the bottom electrodes 301 in the openings 61 in the insulating layer 612. The top electrodes 302 can be formed over the non-volatile memory cells 300 extending in a direction different (e.g., perpendicular) from that of the bottom electrodes 301, resulting in a structure shown in FIGS. 4E (side cross-sectional view) and FIG. 4F (perspective view).

Alternatively, the storage element 328 may be located below the diode steering element 320. FIGS. 5A through 5E show side cross-sectional views illustrating stages in formation of such a device in a non-limiting example.

Figure 5A:
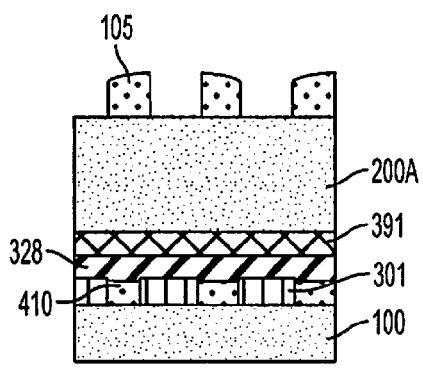
FIGS. 5A-5G are side cross-sectional views illustrating a process flow of another embodiment.

Referring to FIG. 5A, bottom electrodes 301 separated by insulating material are formed over the substrate 100. A switching material layer 328 is provided over the bottom electrodes 301 and separator insulating layer 410, and an optional seed layer 391 is provided over the switching material layer 328 and below the underlying layer 200A. This configuration is similar to the one provided in FIG. 3F. In this embodiment, the underlying layer 200 may comprise a sacrificial layer 200A, such as a-C material.

Figure 5B:
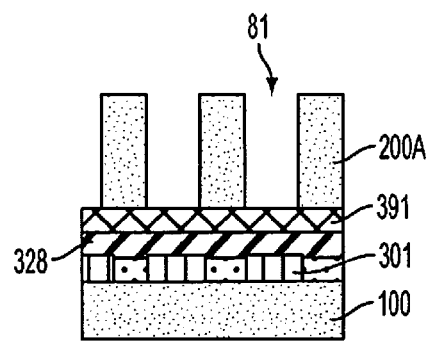

Next, the underlying layer 200A is patterned using the spacer features 105 as a mask to form openings 81 in the underlying layer 200A, resulting in a structure shown in FIG. 5B. If desired, a portion of the spacer features 105 and/or optional etch stop layer 403 may be retained on top of layer 200A to act as a hard mask.

Figure 5C:
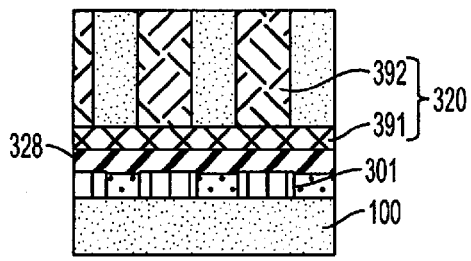

The semiconductor features 392 can then be selectively deposited in the openings 81 over the seed material 391, resulting in a structure shown in FIG. 5C. The seed material 391 and the semiconductor features 392 form diodes 320. The diodes 320 may have a bottom heavily doped n-type region (e.g., an n-type seed layer), an optional intrinsic region (a region which is not intentionally doped), and a top heavily doped p-type region. The orientation of the diodes may be reversed. The diodes may be formed by depositing intrinsic semiconductor material on the n-type or p-type seed material followed by implanting the other one of the p-type or n-type dopants into the upper portion of the semiconductor features 392. Alternatively, the upper regions of the p-i-n diodes may be formed by depositing a doped semiconductor material on the intrinsic semiconductor material.

In an alternative embodiment, the diodes 320 may be formed by non-selective deposition methods. In this embodiment, the seed material layer 391 may be omitted, and the semiconductor features 392 encompass the entire structure of diodes 320. The semiconductor material may be deposited over the top of layer 200A followed by planarization (e.g., by CMP) with the top of layer 200A (or with top of hard mask formed by spacer features and/or etch stop layer as described above).

Figure 5D:
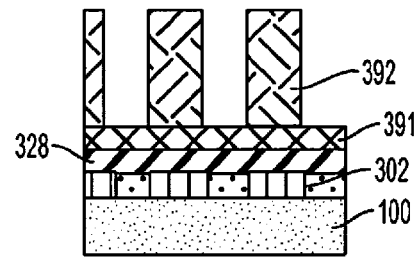

Next, the sacrificial underlying layer 200A can be removed, resulting diodes 320 separated from each other by spaces 381, as shown in FIG. 5D. The diodes 320 can be pillar shaped. In some embodiments, at least some of the diodes 320 are cylindrical and others are quasi-cylindrical, as described above.

Figure 5E:
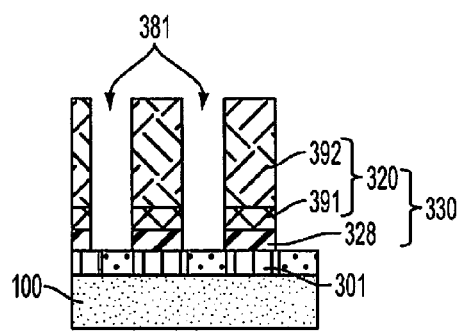
Figure 5F:
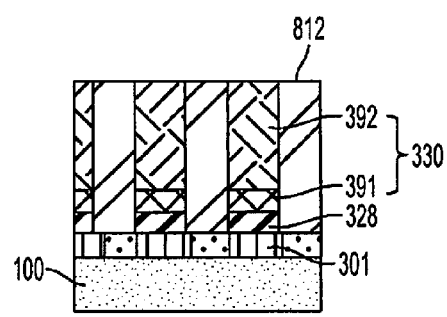

Turning to FIG. 5E, the optional seed layer 391 (if existing) and the switching material 328 exposed in spaces 381 can then be etched using the semiconductor features 392 as a mask, resulting in non-volatile memory cells 300 separated from each other by spaces 381. An insulating filler layer 812 is then formed between the non-volatile memory cells 300, resulting in a structure shown in FIG. 5F. The insulating filler layer 812 may comprise an optional silicon nitride liner and a silicon oxide gap fill material filling the space between adjacent liner portions. Layer 812 may be formed over the pillars 300 followed by planarization by CMP with the tops of the pillars 300.

Figure 5G:
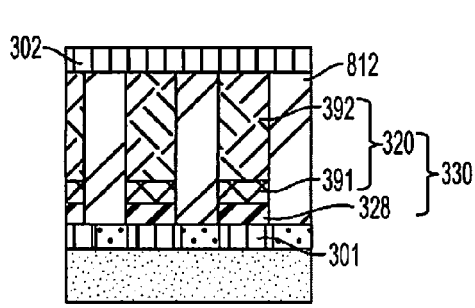
Figure 5H:
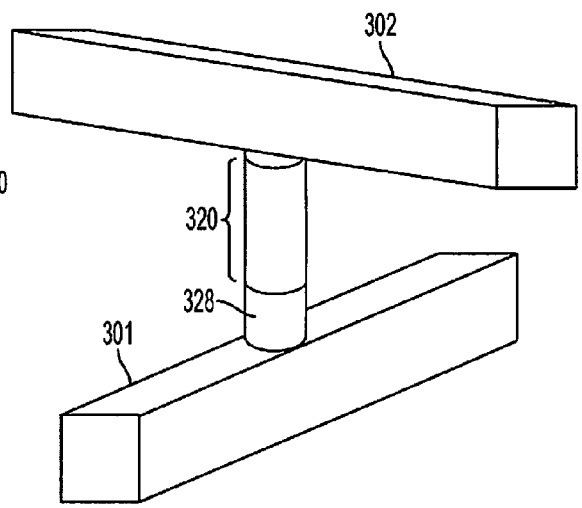
FIG. 5H is a perspective view of the structure shown in FIG. 5G.

The top electrodes 302 can be formed over the non-volatile memory cells 300 extending to a direction different from that of the bottom electrodes 301, resulting in a structure shown in FIGS. 5G (side cross-sectional view) and FIG. 5H (perspective view). The perspective view of the resulting structure shown in FIG. 5H is substantially the same as that shown in FIG. 4F, except that the switching material 328 is located below, rather than above, the diode 320.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate 100 may include integrated circuits fabricated thereon, such as driver circuits for a memory device.

The conductive material of the electrodes 301 and 302 can independently comprise any one or more suitable conducting material known in the art, such as tungsten, copper, aluminum, tantalum, titanium, cobalt, titanium nitride or alloys thereof. For example, in some embodiments, tungsten is preferred to allow processing under a relatively high temperature. In some other embodiments, copper or aluminum is a preferred material.

The insulating material 612 and 812 can independently comprise any electrically insulating material, such as silicon oxide, silicon nitride, silicon oxynitride, or other high-k insulating materials.

Any suitable semiconductor materials can be used for semiconductor diodes 320, for example silicon, germanium, silicon germanium, or other compound semiconductor materials, such as III-V, II-VI, etc. materials. As explained above, the semiconductor material may be formed by any suitable selectively or non-selectively deposition methods. In one embodiment, the semiconductor material in at least one of the first and second device levels is selectively deposited by low pressure chemical vapor deposition (LPCVD). For example, the method described in U.S. application Ser. No. 12/216,924 filed on Jul. 11, 2008 or U.S. application Ser. No. 12/007,781 (published as US Published Application 2009/0179310 A1), incorporated herein by reference in their entirety, may be used to deposit polysilicon. Alternatively, the methods described in U.S. application Ser. No. 11/159,031 filed on Jun. 22, 2005 (which published as US Published Application 2006/0292301 A1) and in U.S. application Ser. No. 12/007,780 filed on Jan. 15, 2008, incorporated herein by reference in their entirety, may be used to deposit the germanium. The semiconductor material may be amorphous, polycrystalline or single crystal. For example, the material may comprise polysilicon. The optional seed layer 391 may comprise any suitable semiconductor or silicide seed material which allows selective growth of the semiconductor materials of the diodes 320. For example, the seed layer 391 may comprise polysilicon to grow additional polysilicon of the diodes 320.

The non-volatile memory cells 300 may be one-time programmable (OTP) or re-writable. The switching material 328 can be one of antifuse, fuse, metal oxide memory, switchable complex metal oxide, carbon nanotube memory, graphene resistivity switchable material, carbon resistivity switchable material (e.g., amorphous and/or polycrystalline carbon), phase change material memory, conductive bridge element, or switchable polymer memory. The antifuse dielectric layer can be one of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

The methods of forming one memory device level have been explained above. Additional memory levels can be formed above or below the memory device level described above to form a monolithic three dimensional memory array having more than one device levels. A monolithic three dimensional memory array is one in which multiple memory levels are formed above a single substrate, such as a wafer, with no intervening substrates. The layers forming one memory level are deposited or grown directly over the layers of an existing level or levels. In some embodiments, electrodes can be shared between memory levels; i.e. top electrode 302 shown in FIGS. 4F and 5H would serve as the bottom electrode of the next memory level. In other embodiments, an interlevel dielectric (not shown) is formed above the first memory level, its surface planarized, and construction of a second memory level begins on this planarized interlevel dielectric, with no shared conductors.

The foregoing details description has described only a few of the many possible implementations of the present invention. For this reason, this detailed description is intended by way of illustration, and not by way of limitations. Although certain supporting circuits and fabrication steps are not specifically described, such circuits and protocols are well known, and no particular advantage is afforded by specific variations of such steps in the context of practicing this invention Variations and modifications of the embodiments disclosed herein may be made based on the description set forth herein, without departing from the scope and spirit of the invention. It is only the following claims, including all equivalents, that are intended to define the scope of this invention.

What is claimed is:
1. A method of making a device, comprising:
providing a switching material layer;
providing a semiconductor seed layer over the switching material layer;
forming the underlying layer over the switching material layer;
forming a first sacrificial layer over the underlying layer;
forming a first photoresist layer over the first sacrificial layer;
patterning the first photoresist layer to form first photoresist features;
rendering the first photoresist features insoluble to a solvent;
forming a second photoresist layer over the first photoresist features;
patterning the second photoresist layer to form second photoresist features;
etching the first sacrificial layer using both the first and the second photoresist features as a mask to form first sacrificial features;
forming a spacer layer over the first sacrificial features;
etching the spacer layer to form spacer features and to expose the first sacrificial features;
removing the first sacrificial features;
etching the underlying layer using the spacer features as a mask to form openings in the underlying layer; and
forming semiconductor features in the openings in the underlying layer;
removing the underlying layer;
etching the semiconductor seed layer using the semiconductor features as a mask;
etching the switching material layer using the semiconductor features as a mask to form switching material features after the step of removing the underlying layer; and
forming an insulating filler layer between the semiconductor features after the step of etching the switching material layer.
2. The method of claim 1, wherein the openings in the underlying layer are pillar shaped.
3. The method of claim 2, wherein at least some of the openings are cylindrical and others are quasi-cylindrical.
4. The method of claim 1, wherein the first sacrificial layer comprises organic hard mask material.
5. The method of claim 1, wherein:
the first photoresist layer comprises a first composition;
the second photoresist comprises a second composition; and
the second composition is the same or different from the first composition.
6. The method of claim 1, wherein:
the step of rendering the first photoresist features insoluble to the solvent forms a barrier layer over the first photoresist features;
the barrier layer comprises a thin polymer film having a thickness of less than 10 nm which is disposed on a surface of first photoresist features, such that the first sacrificial layer is exposed in area between first photoresist features; and
the barrier layer protects the first photoresist features from being dissolved by the solvent used during the step of patterning the second photoresist layer.

7. The method of claim 1, wherein the underlying layer is a hard mask layer comprising oxide or nitride insulating material.

8. The method of claim 1, wherein the step of forming semiconductor features in the openings in the underlying layer comprises selectively depositing semiconductor features in the openings in the underlying layer.

9. The method of claim 1, wherein the underlying layer comprises organic hard mask material.

10. The method of claim 1, wherein:
the step of forming an insulating filler layer between the semiconductor features forms non-volatile memory cells separated by insulating material of the insulating filler layer;
the switching material features comprise storage elements of the nonvolatile memory cells;
the etched semiconductor seed layer comprises lower portions of diodes;
the semiconductor features comprise upper portions of the diodes; and
the diodes comprise steering elements of the non-volatile memory cells.

11. A method of making a device, comprising:
forming a first sacrificial layer over an underlying layer;
forming a first photoresist layer over the first sacrificial layer;
patterning the first photoresist layer to form first photoresist features;
rendering the first photoresist features insoluble to a solvent;
forming a second photoresist layer over the first photoresist features;
patterning the second photoresist layer to form second photoresist features;
etching the first sacrificial layer using both the first and the second photoresist features as a mask to form first sacrificial features;
forming a spacer layer over the first sacrificial features;
etching the spacer layer to form spacer features and to expose the first sacrificial features;
removing the first sacrificial features;
etching the underlying layer using the spacer features as a mask to form openings in the underlying layer;
forming semiconductor features in the openings in the underlying layer, wherein the step of forming semiconductor features in the openings in the underlying layer comprises selectively depositing semiconductor features in the openings in the underlying layer to leave recesses over the semiconductor features; and
forming switching material features in the recesses over the semiconductor features;
wherein:
the semiconductor features comprise steering elements of non-volatile memory cells; and
the switching material features comprise storage elements of the nonvolatile memory cells.

12. The method of claim 11, wherein the openings in the underlying layer are pillar shaped and the steering elements comprise semiconductor diodes.

13. The method of claim 12, wherein at least some of the openings are cylindrical and others are quasi-cylindrical.

14. The method of claim 11, wherein the first sacrificial layer comprises organic hard mask material.

15. The method of claim 11, wherein:
the first photoresist layer comprises a first composition;
the second photoresist comprises a second composition; and
the second composition is the same or different from the first composition.

16. The method of claim 11, wherein:
the step of rendering the first photoresist features insoluble to the solvent forms a barrier layer over the first photoresist features;
the barrier layer comprises a thin polymer film having a thickness of less than 10 nm which is disposed on a surface of first photoresist features, such that the first sacrificial layer is exposed in area between first photoresist features; and
the barrier layer protects the first photoresist features from being dissolved by the solvent used during the step of patterning the second photoresist layer.

17. The method of claim 11, wherein the underlying layer is a hard mask layer comprising oxide or nitride insulating material.

18. A method of making a device, comprising:
forming a first sacrificial layer over an underlying layer;
forming a first photoresist layer over the first sacrificial layer;
patterning the first photoresist layer to form first photoresist features;
rendering the first photoresist features insoluble to a solvent;
forming a second photoresist layer over the first photoresist features;
patterning the second photoresist layer to form second photoresist features;
etching the first sacrificial layer using both the first and the second photoresist features as a mask to form first sacrificial features;
forming a spacer layer over the first sacrificial features;
etching the spacer layer to form spacer features and to expose the first sacrificial features;
removing the first sacrificial features;
etching the underlying layer using the spacer features as a mask to form openings in the underlying layer;
forming semiconductor features in the openings in the underlying layer;
recessing the semiconductor features; and
forming switching material features in recesses over the semiconductor features;
wherein:
the semiconductor features comprise steering elements of non-volatile memory cells; and
the switching material features comprise storage elements of the nonvolatile memory cells.

19. The method of claim 18, wherein the openings in the underlying layer are pillar shaped and the steering elements comprise semiconductor diodes.

20. The method of claim 19, wherein at least some of the openings are cylindrical and others are quasi-cylindrical.

21. The method of claim 18, wherein the first sacrificial layer comprises organic hard mask material.

22. The method of claim 18, wherein:
the first photoresist layer comprises a first composition;
the second photoresist comprises a second composition; and
the second composition is the same or different from the first composition.

23. The method of claim 18, wherein:
the step of rendering the first photoresist features insoluble to the solvent forms a barrier layer over the first photoresist features;
the barrier layer comprises a thin polymer film having a thickness of less than 10 nm which is disposed on a surface of first photoresist features, such that the first sacrificial layer is exposed in area between first photoresist features; and the barrier layer protects the first photoresist features from being dissolved by the solvent used during the step of patterning the second photoresist layer.

24. The method of claim 18, wherein the underlying layer is a hard mask layer comprising oxide or nitride insulating material.

25. A method of making a non-volatile memory device, comprising:

forming a switching material layer over a substrate;
forming a semiconductor seed layer over the switching material layer;
forming an underlying layer over the semiconductor seed layer;
forming a first photoresist layer over the underlying layer;
patterning the first photoresist layer to form first photoresist features;
rendering the first photoresist features insoluble to a solvent;
forming a second photoresist layer over the first photoresist features;
patterning the second photoresist layer to form second photoresist features;
etching the first sacrificial layer using both the first and the second photoresist features as a mask to form first sacrificial features;
removing the first and the second photoresist features;
forming a spacer layer over the first sacrificial features;
etching the spacer layer to form spacer features and to expose the sacrificial features;
removing the first sacrificial features;
etching the underlying layer using the spacer features as a mask to form openings in the underlying layer;
forming semiconductor features on the semiconductor seed layer exposed in the openings in the underlying layer;
removing the underlying layer;
etching the semiconductor seed layer using the semiconductor features as a mask,
etching the switching material layer using the semiconductor features as a mask to form switching material features; and
forming an insulating filler layer between adjacent semiconductor features and between adjacent switching material features;

wherein:
the etched semiconductor seed layer comprises lower portions of diodes;
the semiconductor features comprise upper portions of the diodes;
the diodes comprise steering elements of non-volatile memory cells; and
the switching material features comprise storage elements of the nonvolatile memory cells.

26. The method of claim 25, wherein:
the step of rendering the first photoresist features insoluble to the solvent forms a barrier layer over the first photoresist features;
the barrier layer comprises a thin polymer film having a thickness of less than 10 nm which is disposed on a surface of first photoresist features; and
the barrier layer protects the first photoresist features from being dissolved by the solvent used during the step of patterning the second photoresist layer.

27. The method of claim 25, wherein the openings and the semiconductor features are pillar shaped.

28. The method of claim 27, wherein at least some of the openings are cylindrical and others of the openings are quasi-cylindrical.

* * * * *